United States Patent
Park

(10) Patent No.: US 9,287,214 B2
(45) Date of Patent: Mar. 15, 2016

(54) SEMICONDUCTOR DEVICE

(71) Applicant: SK HYNIX INC., Icheon (KR)

(72) Inventor: Dae Sik Park, Icheon (KR)

(73) Assignee: SK HYNIX INC., Icheon (KR)

( * ) Notice: Subject to any disclaimer, the term of this patent is extended or adjusted under 35 U.S.C. 154(b) by 72 days.

(21) Appl. No.: 14/185,860

(22) Filed: Feb. 20, 2014

(65) Prior Publication Data

US 2014/0167250 A1 Jun. 19, 2014

Related U.S. Application Data

(62) Division of application No. 13/279,019, filed on Oct. 21, 2011, now abandoned.

(30) Foreign Application Priority Data

Nov. 4, 2010 (KR) ........................ 10-2010-0109368

(51) Int. Cl.
| | |
|---|---|
| *H01L 23/532* | (2006.01) |
| *H01L 21/768* | (2006.01) |
| *H01L 29/66* | (2006.01) |
| *H01L 27/108* | (2006.01) |

(52) U.S. Cl.
CPC .... *H01L 23/53295* (2013.01); *H01L 21/76826* (2013.01); *H01L 21/76832* (2013.01); *H01L 21/76834* (2013.01); *H01L 27/10885* (2013.01); *H01L 27/10888* (2013.01); *H01L 29/6656* (2013.01); *H01L 2924/0002* (2013.01); *H01L 2924/00013* (2013.01)

(58) Field of Classification Search
CPC ................ H01L 29/6656; H01L 23/53295; H01L 27/10885; H01L 27/10888
See application file for complete search history.

(56) References Cited

U.S. PATENT DOCUMENTS

| | | | | |
|---|---|---|---|---|
| 8,530,312 | B2 * | 9/2013 | Filippini | ........... H01L 21/31111 257/228 |
| 9,118,003 | B2 * | 8/2015 | Park | ........... H01L 45/1253 |
| 2011/0073925 | A1 * | 3/2011 | Park | ........... H01L 21/28518 257/306 |
| 2012/0300557 | A1 * | 11/2012 | Kim | ........... H01L 27/10876 365/189.05 |
| 2012/0302047 | A1 * | 11/2012 | Lee | ........... H01L 27/10876 438/482 |
| 2013/0320549 | A1 * | 12/2013 | Lee | ........... H01L 23/4821 257/773 |
| 2015/0228491 | A1 * | 8/2015 | Kang | ........... H01L 21/28194 257/330 |
| 2015/0318293 | A1 * | 11/2015 | Lee | ........... H01L 27/11573 257/392 |

FOREIGN PATENT DOCUMENTS

| | | |
|---|---|---|
| KR | 10-2002-0075219 A | 10/2002 |
| KR | 10-2007-0098319 A | 10/2007 |

* cited by examiner

*Primary Examiner* — David Zarneke

(57) ABSTRACT

A semiconductor device and a method of forming the same are disclosed, which forms a low-dielectric-constant oxide film only at a peripheral part of a bit line conductive material, resulting in reduction in parasitic capacitance of the bit line. The semiconductor device includes a bit line formed over a semiconductor substrate, a first spacer formed over sidewalls of the bit line, and a second spacer formed over sidewalls of the first spacer, configured to have a dielectric constant lower than that of the first spacer.

9 Claims, 5 Drawing Sheets

SEMICONDUCTOR DEVICE

CROSS-REFERENCE TO RELATED APPLICATION

The present application is a divisional of U.S. patent application Ser. No. 13/279,019, filed on Oct. 21, 2011, which claims priority of Korean Patent Application No. 10-2010-0109368 filed on 4 Nov. 2010, which are incorporated by reference in their entirety.

BACKGROUND OF THE INVENTION

Embodiments of the present invention relate to a semiconductor device and a method for forming the same, and more particularly to a semiconductor device including a bit line spacer and a method for forming the same.

As the integration degree of a semiconductor device increases, the distance between lines is reduced and the thickness of the insulation film used to isolate a word line, a bit line, and a capacitor from each other is gradually reduced.

The reduction in thickness of the insulation film may increase parasitic capacitance (Cb), resulting in deterioration of semiconductor device characteristics.

In order to prevent parasitic capacitance from increasing, the thickness of the insulation film may be increased or a low dielectric constant ("low-k dielectric") material may be used. However, when the thickness of the insulation film is increased, it becomes harder to fill a gap between the insulation films. In addition, a low dielectric film has a poor gap-fill characteristic.

In addition, as integration degree increases, the distance between patterns is gradually reduced. In the conventional art, various kinds of nitride film have been employed as an insulating film. However, since nitride material has a high dielectric constant, parasitic capacitance can occur.

FIGS. 1A and 1B illustrate a method for forming a semiconductor device according to the related art. A semiconductor device according to the related art will hereinafter be described with reference to FIGS. 1A and 1B.

Referring to FIG. 1A, a bit line 20 formed in a laminated structure of a bit line conductive material 15 and a hard mask layer 17 is formed over a semiconductor substrate 10. Subsequently, a spacer 25 is deposited over the entire surface of the semiconductor substrate 10, including the bit line 20. In this case, the spacer 25 is formed of a nitride film.

Referring to FIG. 1B, an interlayer insulation film (not shown) is formed over the entire surface of the semiconductor substrate 10 including the bit line 20 over which the spacer 25 is formed. Subsequently, the interlayer insulation film (not shown) and the spacer 25 formed over the semiconductor substrate 10 are etched to form a storage node contact hole where the semiconductor substrate 10 is exposed. After that, a polysilicon layer is buried in the storage node contact hole, and a planarization process is performed exposing the bit line 20 and forming a storage node contact 30.

As described above, since the spacer, which is formed over sidewalls of the bit line, is formed of a high-dielectric-constant nitride film, parasitic capacitance of the bit line is unavoidably increased, resulting in deterioration of characteristics of the semiconductor device.

BRIEF SUMMARY OF THE INVENTION

Various embodiments of the present invention are directed to providing a semiconductor device that substantially obviates one or more problems due to limitations and disadvantages of the related art.

An embodiment of the present invention relates to a semiconductor device including a bit line spacer and a method for forming the same, which includes a low-dielectric-constant oxide film formed only at a peripheral part of a bit line conductive material, resulting in a reduction in parasitic capacitance of the bit line.

In accordance with an aspect of the present invention, a semiconductor device includes a bit line formed over a semiconductor substrate, a first spacer formed over sidewalls of the bit line, and a second spacer formed over the first spacer and configured to have a dielectric constant lower than that of the first spacer.

The bit line may include a bit line conductive material and a hard mask layer. The first spacer may include a nitride film. The second spacer may include an oxide film. The second spacer may be formed over an entire surface of the first spacer. Alternatively, the second spacer may be formed at partial sidewalls of the first spacer.

The second spacer may be formed over the first spacer formed over sidewalls of the bottom of the bit line conductive material. The semiconductor device may further include a third spacer formed over the first spacer and the second spacer.

In accordance with another aspect of the present invention, a semiconductor device includes a bit line formed over a semiconductor substrate, a first spacer formed over sidewalls of the bit line, a second spacer formed over the first spacer and configured to have a dielectric constant lower than that of the first spacer, and a third spacer formed over the first spacer and the second spacer.

In accordance with still another aspect of the present invention, a method for forming a semiconductor device includes: forming a bit line over a semiconductor substrate; forming a first spacer at sidewalls of the bit line; and forming a second spacer having a dielectric constant lower than that of the first spacer over the first spacer.

The forming of the bit line may include forming a bit line conductive material and a hard mask layer over the semiconductor substrate; and patterning the hard mask layer and the bit line conductive material. The first spacer may include a nitride film.

The second spacer may include an oxide film. The second spacer may be formed by oxidizing the first spacer.

The forming of the second spacer may include forming a buffer film covering the first spacer formed at the top of the bit line; oxidizing a surface of the first spacer exposed by the buffer film; and removing the buffer film. The buffer film may be formed to cover the first spacer formed over sidewalls of the hard mask. The buffer film may include an oxide film. The buffer film may be formed of a material including an Un-doped Silicate Glass (USG) film.

The buffer film may be removed by a dry etch method. The method for forming the semiconductor may further include, after the formation of the second spacer, forming a third spacer over the second spacer.

In accordance with another aspect of the present invention, a semiconductor device includes a bit line and a storage node pattern disposed over a semiconductor substrate, and a spacer disposed between the bit line and the storage node pattern, wherein the spacer includes: a first insulation film disposed over the bit line, a second insulation film disposed over the storage node pattern, and an third film disposed between the first and the second nitride film, wherein the third film is formed of material having dielectric constant higher than any of the first and the second insulation films. The bit line includes a bit line conductive pattern and a mask pattern disposed over the conductive pattern, and wherein spacer is disposed between the bit line conductive pattern and the storage node pattern.

The spacer further extends between the mask pattern and the storage node pattern.

The first and the third insulation film include nitride material, respectively, and the second insulation film includes oxide material.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts. A semiconductor device and a method for forming the same according to embodiments of the present invention will hereinafter be described with reference to the accompanying drawings.

Figure 1A:
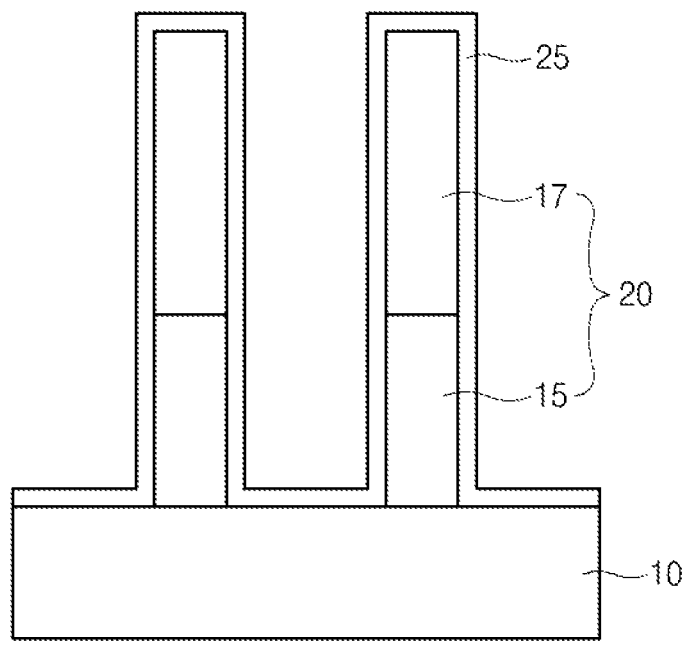
FIGS. 1A and 1B illustrate a method for forming a semiconductor device according to the related art.
Figure 1B:
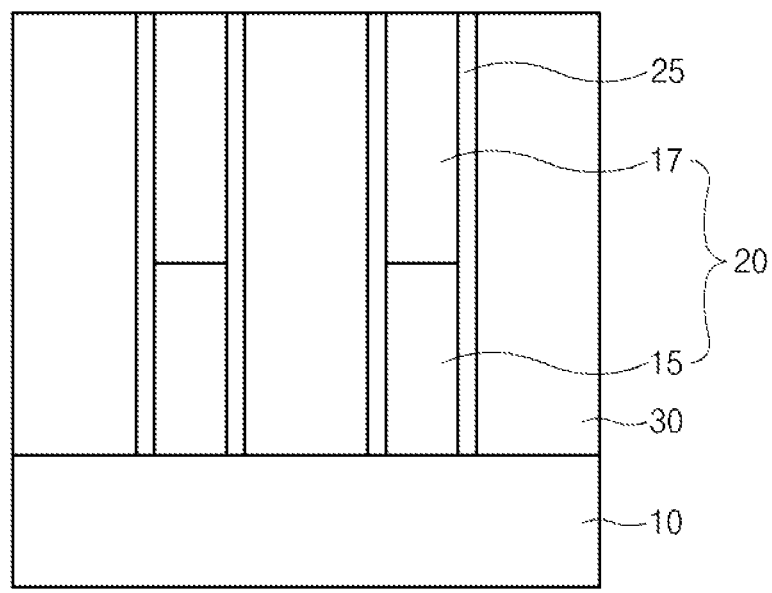
Figure 2A:
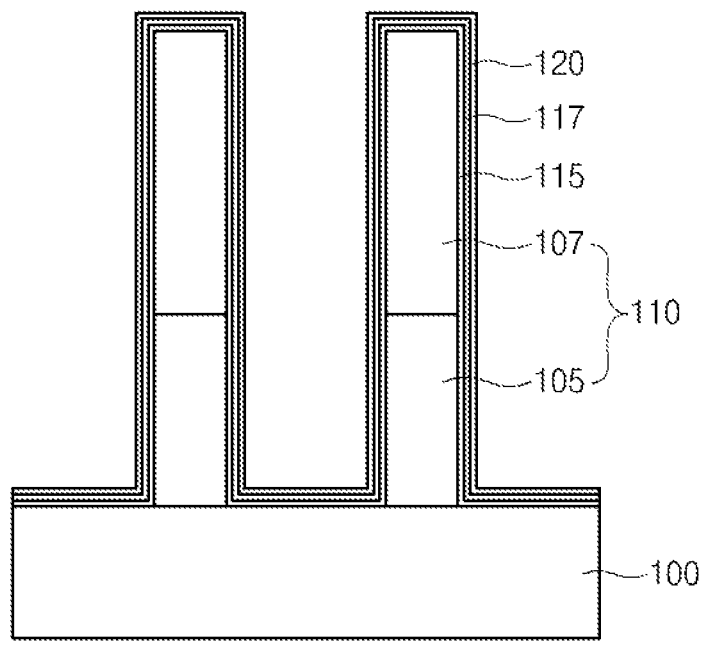
FIGS. 2A and 2B are cross-sectional views illustrating a method for forming a semiconductor device according to an embodiment of the present invention.
Figure 2B:
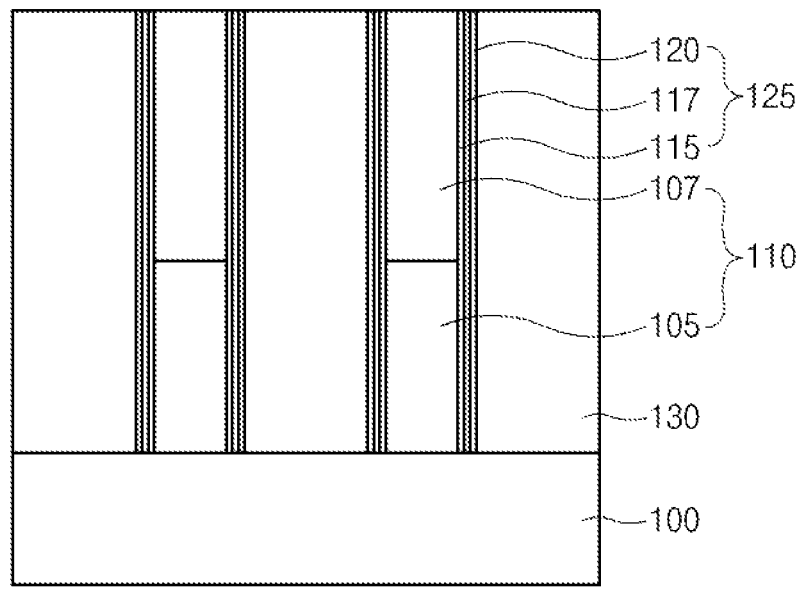

FIGS. 2A and 2B are cross-sectional views illustrating a method for manufacturing a semiconductor device according to an embodiment of the present invention. Referring to FIG. 2A, a bit line conductive layer 105 and a hard mask layer 107 are formed over a semiconductor substrate 100. The hard mask layer 107 and the bit line conductive layer 105 are patterned to form a bit line 110. A first spacer 115, a second spacer 117 and a third spacer 120 are sequentially formed over the semiconductor substrate 100 including the bit line 110. The first spacer 115 and the third spacer 120 may be formed of a material including a nitride film. The second spacer 117 may be formed of a material that has a dielectric constant that is lower than that of the first spacer 115 and the third spacer 120. For example, the second spacer 117 may be formed of a material including an oxide film.

Referring to FIG. 2B, an interlayer insulation film (not shown) is formed over the semiconductor substrate 100, including the bit line 110 and the first spacer 115, the second spacer 117, and the third spacer 120. Thereafter, the first spacer 115, the second spacer 117, and the third spacer 120 and the semiconductor substrate 100 are etched such that the semiconductor substrate 100 is exposed to form a storage node contact hole. Subsequently, a conductive material, which will be used as a storage node, is formed over the entire surface including the storage node contact hole. A planarization process is performed until the hard mask layer 107 formed over the bit line 110 is exposed, thus forming storage node contact 130.

As described above, since a spacer including a low-dielectric-constant oxide film is formed, parasitic capacitance of the bit line is reduced, so that the sensing margin of the semiconductor device is increased, resulting in increased production yield of the semiconductor device.

FIGS. 3A to 3E are cross-sectional views illustrating a method for forming a semiconductor device according to another embodiment of the present invention.

Figure 3A:
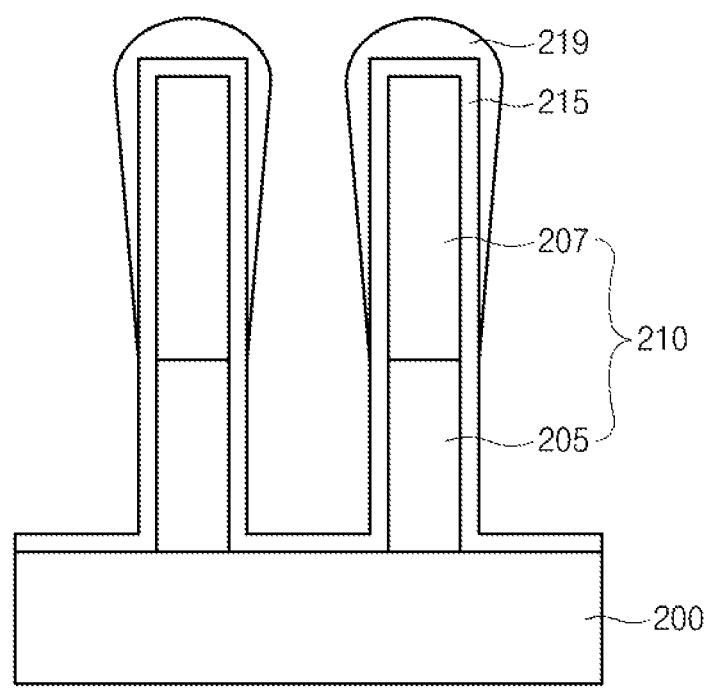
FIGS. 3A to 3E are cross-sectional views illustrating a method for forming a semiconductor device according to another embodiment of the present invention.

Referring to FIG. 3A, a bit line conductive material (i.e., a bit line conductive layer) 205 and a hard mask layer 207 are formed over a semiconductor substrate 200. Subsequently, the hard mask layer 207 and the bit line conductive material 205 are patterned to form a bit line 210.

A first spacer 215 is formed over the semiconductor substrate 200 including the bit line 210. Preferably, the first spacer 215 may include a nitride film. Subsequently, a buffer film 219 is formed over an upper portion of the bit line 210. In an embodiment, the buffer film 219 may be formed of an oxide film which has a poor step coverage property, so that it may not be formed at a bottom portion of the bit line 210. The buffer film 219 may include an Un-doped Silicate Glass (USG) film. In an embodiment, the buffer film 219 may be formed only over the hard mask layer 207. In other words, in an embodiment, a portion of the first spacer 215 located at the bottom of the bit line 210, for example, the portion of the first spacer 215 disposed over the bit line conductive material 205, may be exposed.

Figure 3B:
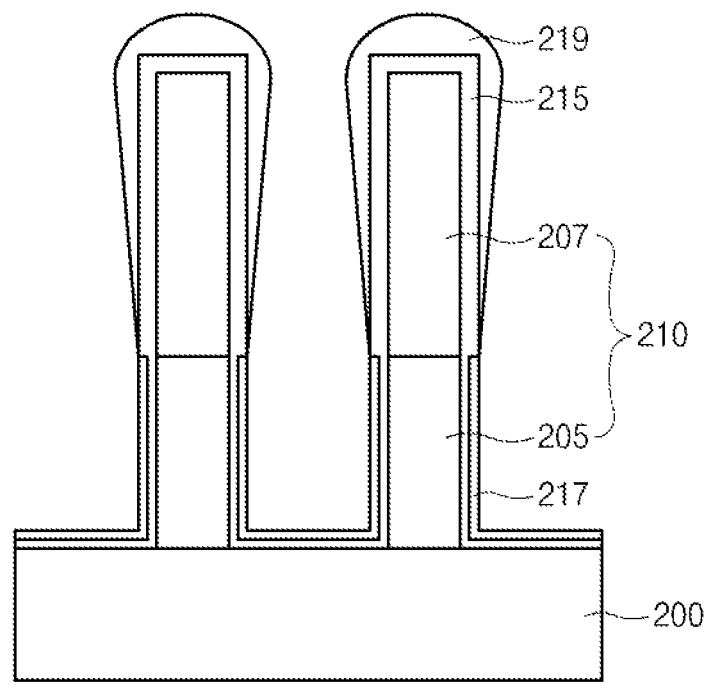

Referring to FIG. 3B, the exposed surface of the first spacer 215 is oxidized to form a second spacer 217. The process for oxidizing the first spacer material 215 may be performed by a plasma oxidization process. The upper portion of the first spacer 215, which is covered by the buffer film 219, is not oxidized. In an embodiment, the oxidization process is performed in the direction from the surface of the first spacer 215 to the inside thereof, and at the same time an oxide film is also formed over the first spacer 215. That is, the second spacer 217 is formed not only over sidewalls of the bit line conductive layer 205 but also over the surface of the semiconductor substrate 200.

Figure 3C:
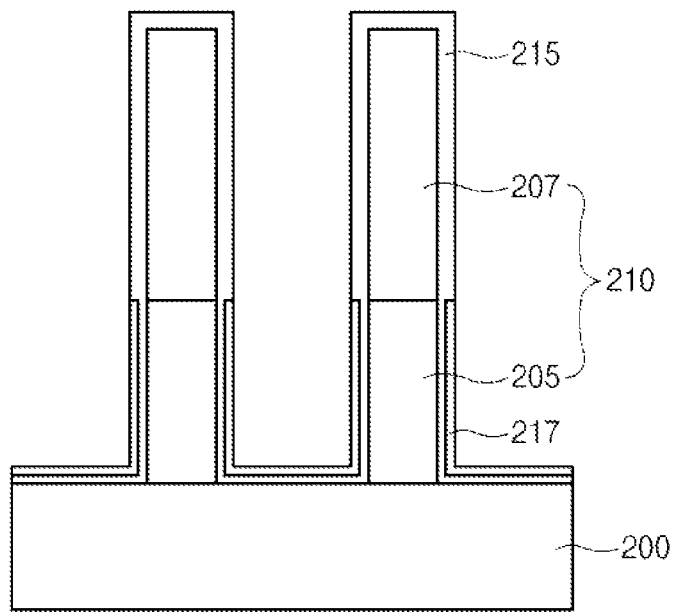
Figure 3D:
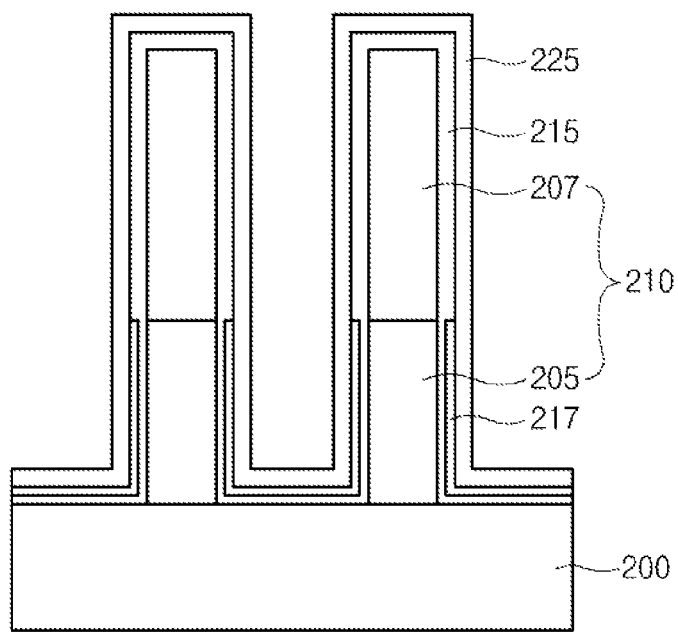

Referring to FIG. 3C, the buffer film 219 is removed. The process for removing the buffer film 219 may be carried out using a dry etch process. Referring to FIG. 3D, a third spacer 225 is formed over the semiconductor substrate 200 including the first spacer 215 and the second spacer 217. The third spacer 225 may include a nitride film. For example, the third spacer 225 may be formed of the same material as the first spacer 215.

Figure 3E:
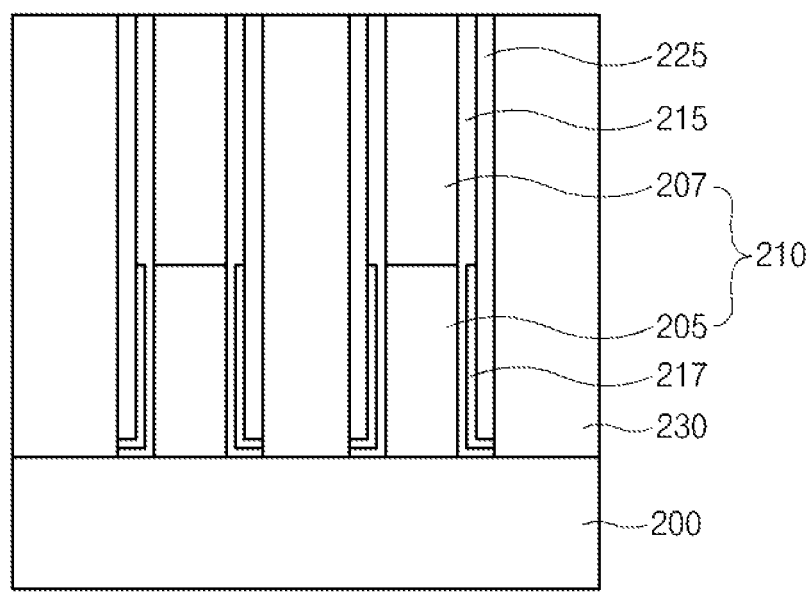

Referring to FIG. 3E, an interlayer insulation film (not shown) is formed over the semiconductor substrate 200 including the bit line 210. Thereafter, the first spacer 215, the second spacer 217 and the third spacer 225 and the semiconductor substrate 200 are etched so that a storage node contact hole exposing the semiconductor substrate 200 is formed. Subsequently, a conductive material to be used as a storage node is formed over the entire surface, including the storage node contact hole. A planarization process is performed until the hard mask layer 207 is exposed, so that the storage node contact 230 is formed. In an embodiment, the second spacer 217 formed of an oxide film is not exposed by a planarization process. Since the oxide film has a faster etching speed (higher etch selectivity) than the nitride film, the second spacer 217 can be attacked when the interlayer insulation film, which may be for example, formed of an oxide, is etched by an etching solution. However, in this embodiment, since the second spacer is formed at a lower portion of the bit line 210, it can be protected from such an attack. That is, a multi-layered spacer formed at an upper portion of the bit line 210 does not include the second spacer 217 while a multi-layered spacer formed at a lower portion of the bit line includes the second spacer 217 formed of an oxide layer.

As is apparent from the above description, in case of the semiconductor device and a method for forming the same according to embodiments of the present invention, the second spacer 217 formed of a low-dielectric-constant oxide film is formed only at a peripheral part of the bit line conductive layer 205, which is formed at the bottom of the bit line 210, so that it is not damaged by the etching solution in a subsequent process and parasitic capacitance of the bit line is reduced. As a result, the sensing margin and the production yield of the semiconductor device is increased. In addition, a mat size is increased so that the number of net dies on a wafer is increased.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor device comprising:
a bit line disposed over a semiconductor substrate and including a bit line conductive layer and a hard mask layer;
a first spacer disposed over sidewalls of the bit line;
a second spacer disposed over the first spacer and configured to have a dielectric constant lower than that of the first spacer, wherein an upper portion of the second spacer is disposed in substantially the same level as an upper portion of the bit line conductive layer; and
a third spacer disposed over the first spacer and the second spacer.

2. The semiconductor device according to claim 1, wherein the first spacer includes a nitride film.

3. The semiconductor device according to claim 1, wherein the second spacer includes an oxide film.

4. The semiconductor device according to claim 1, wherein the second spacer is disposed over a portion of the first spacer.

5. The semiconductor device according to claim 1, wherein the second spacer is formed over a portion of the first spacer formed such that the second spacer is disposed over the bit line conductive layer.

6. A semiconductor device comprising:
a bit line and a storage node pattern disposed over a semiconductor substrate, the bit line including a bit line conductive pattern and a hard mask pattern; and
a spacer disposed between the bit line and the storage node pattern,
wherein the spacer includes:
a first insulation film disposed over the bit line;
a second insulation film disposed over the storage node pattern, wherein an upper portion of the second insulation film is disposed in substantially the same level as an upper portion of the bit line conductive pattern; and
a third insulation film disposed between the first and the second insulation films,
wherein the third insulation film is formed of a material having a dielectric constant higher than any of the first and the second insulation films.

7. The semiconductor device of claim 6, wherein the hard mask pattern is disposed over the bit line conductive pattern, and
wherein the spacer is disposed between the bit line conductive pattern and the storage node pattern.

8. The semiconductor device of claim 7, wherein the spacer further extends between the hard mask pattern and the storage node pattern.

9. The semiconductor device of claim 7, wherein the first and the third insulation films include a nitride material, respectively, and
wherein the second insulation film includes an oxide material.

* * * * *